(12) United States Patent  
Miyahara

(10) Patent No.: US 11,850,697 B2  
(45) Date of Patent: Dec. 26, 2023

(54) SUBSTRATE PROCESSING APPARATUS AND SUBSTRATE PROCESSING METHOD

(71) Applicant: Tokyo Electron Limited, Tokyo (JP)

(72) Inventor: Osamu Miyahara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 358 days.

(21) Appl. No.: 17/120,857

(22) Filed: Dec. 14, 2020

(65) Prior Publication Data

US 2021/0187691 A1 Jun. 24, 2021

(30) Foreign Application Priority Data

Dec. 24, 2019 (JP) ................................ 2019-233131

(51) Int. Cl.
*B24B 29/00* (2006.01)
*B24B 37/005* (2012.01)
(Continued)

(52) U.S. Cl.
CPC .......... *B24B 29/005* (2013.01); *B24B 37/005* (2013.01); *B24B 37/07* (2013.01);
(Continued)

(58) Field of Classification Search
CPC ..... B24B 7/228; B24B 37/042; B24B 37/005; B24B 37/013; B24B 37/07; B24B 37/107;
(Continued)

(56) References Cited

U.S. PATENT DOCUMENTS 5,938,504 A * 8/1999 Talieh ................... B24B 37/107  
    451/41  
6,602,121 B1 * 8/2003 Halley ................... B24B 37/30  
    483/33

(Continued)

FOREIGN PATENT DOCUMENTS

CN     108453618 A * 8/2018 ............. B24B 21/12  
CN     109531405 A    3/2019  
(Continued)

OTHER PUBLICATIONS

English Translation for Chinese Patent 108453618 A (2018) (Year: 2018).*

*Primary Examiner* — Joel D Crandall  
*Assistant Examiner* — Robert F Neibaur  
(74) *Attorney, Agent, or Firm* — Nath, Goldberg & Meyer; Jerald L. Meyer; Tanya E. Harkins

(57) ABSTRACT

A substrate processing apparatus includes: a holding part for holding a substrate; a rotating part for rotating the holding part to rotate the substrate together with the holding part; a liquid supply part for supplying a cleaning liquid to a main surface of the substrate; a polishing head for polishing the main surface; a moving part for scanning the polishing head in a radial direction of the substrate while pressing the polishing head against the main surface; and a controller for controlling the rotating part, the liquid supply part, and the moving part. The controller sets a division line that divides the main surface into plural areas in the radial direction, and controls the liquid supply part to supply the cleaning liquid for each area and controls the moving part to scan the polishing head for each area while a subsequent supply of the cleaning liquid is stopped.

12 Claims, 9 Drawing Sheets

(51) Int. Cl.
*H01L 21/02* (2006.01)
*B24B 57/02* (2006.01)
*B24B 37/07* (2012.01)

(52) U.S. Cl.
CPC ........ *B24B 57/02* (2013.01); *H01L 21/02013* (2013.01); *H01L 21/02052* (2013.01)

(58) Field of Classification Search
CPC ..... B24B 37/105; B24B 37/10; B24B 49/006; B24B 49/16; B24B 57/02
See application file for complete search history.

(56) References Cited

U.S. PATENT DOCUMENTS

| | | | | |
|---|---|---|---|---|
| 6,875,086 | B2 * | 4/2005 | Golzarian | B24B 53/12 |
| | | | | 451/291 |
| 10,105,812 | B2 * | 10/2018 | Chen | H01L 21/32115 |
| 10,593,554 | B2 * | 3/2020 | Yang | H01L 21/02024 |
| 2019/0283204 | A1 * | 9/2019 | Swedek | B24B 37/105 |

FOREIGN PATENT DOCUMENTS

| | | |
|---|---|---|
| JP | H10-223597 A | 8/1998 |
| JP | 2000-77293 A | 3/2000 |
| JP | 2008-141043 A | 6/2006 |
| JP | 2019-55441 A | 4/2019 |

* cited by examiner

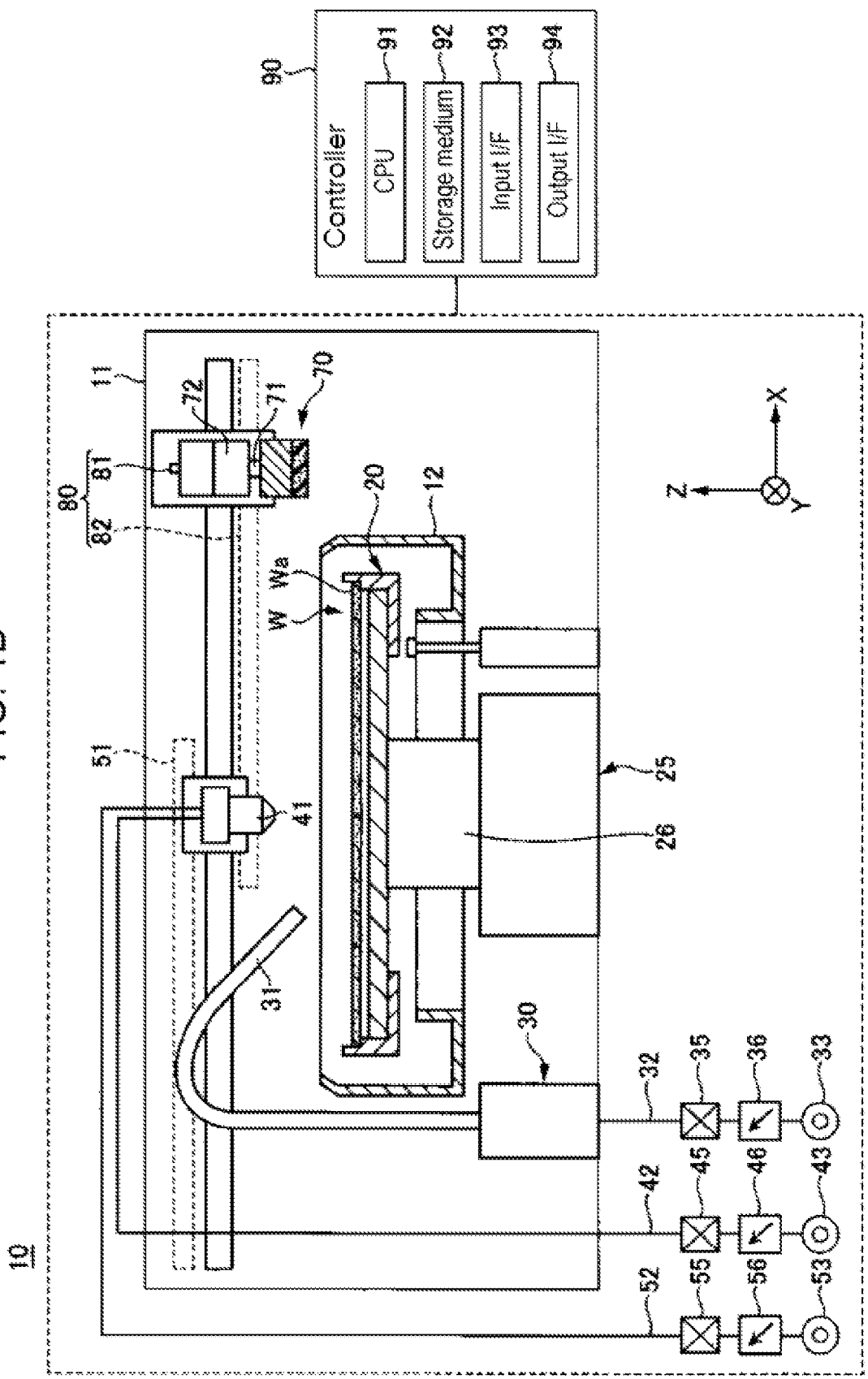

Distance from center point (P0)

| Area | Start point (mm) | End point (mm) | Polishing pressure (MPa) | Scan speed (mm/s) | Substrate rotation speed (rpm) |
|---|---|---|---|---|---|
| Z1 | P0 | P1 | ... | ... | ... |
| Z2 | P1 | P2 | ... | ... | ... |
| Z3 | P2 | P3 | ... | ... | ... |

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-233131, filed on Dec. 24, 2019, the entire contents of which are incorporated herein by reference.

TECHNICAL FIELD

The present disclosure relates to a substrate processing apparatus and a substrate processing method.

BACKGROUND

A substrate processing apparatus disclosed in Patent Document 1 includes a holding part for holding a substrate horizontally, a rotating part for rotating the substrate, a polishing brush for polishing the upper surface of the substrate, a moving part for scanning the polishing brush in the radial direction of the substrate in a state in which the polishing brush is pressed against the upper surface of the substrate, a liquid supply part for supplying a cleaning liquid to the upper surface of the substrate, and a controller for controlling the rotating part, the moving part, and the liquid supply part. As the polishing brush moves outward from inward of the substrate in the radial direction, the scanning speed of the polishing brush decreases and the rotation speed of the substrate also decreases.

PRIOR ART DOCUMENTS

Patent Document

Patent Document 1: Japanese laid-open publication No. 2019-055441

SUMMARY

According to one embodiment of the present disclosure, there is provided a substrate processing apparatus including: a holding part configured to hold a substrate; a rotating part configured to rotate the holding part to rotate the substrate together with the holding part; a liquid supply part configured to supply a cleaning liquid to a main surface of the substrate; a polishing head configured to polish the main surface of the substrate; a moving part configured to scan the polishing head in a radial direction of the substrate while pressing the polishing head against the main surface of the substrate; and a controller configured to control the rotating part, the liquid supply part, and the moving part, wherein the controller sets a division line that divides the main surface of the substrate into a plurality of areas in the radial direction of the substrate, controls the liquid supply part to supply the cleaning liquid to each of the plurality of areas, and controls the moving part to scan the polishing head for each of the plurality of areas in a state in which a subsequent supply of the cleaning liquid is stopped.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1B is a sectional view showing a state of the substrate processing apparatus of FIG. 1A at the time of cleaning.

DETAILED DESCRIPTION

Figure 1A:
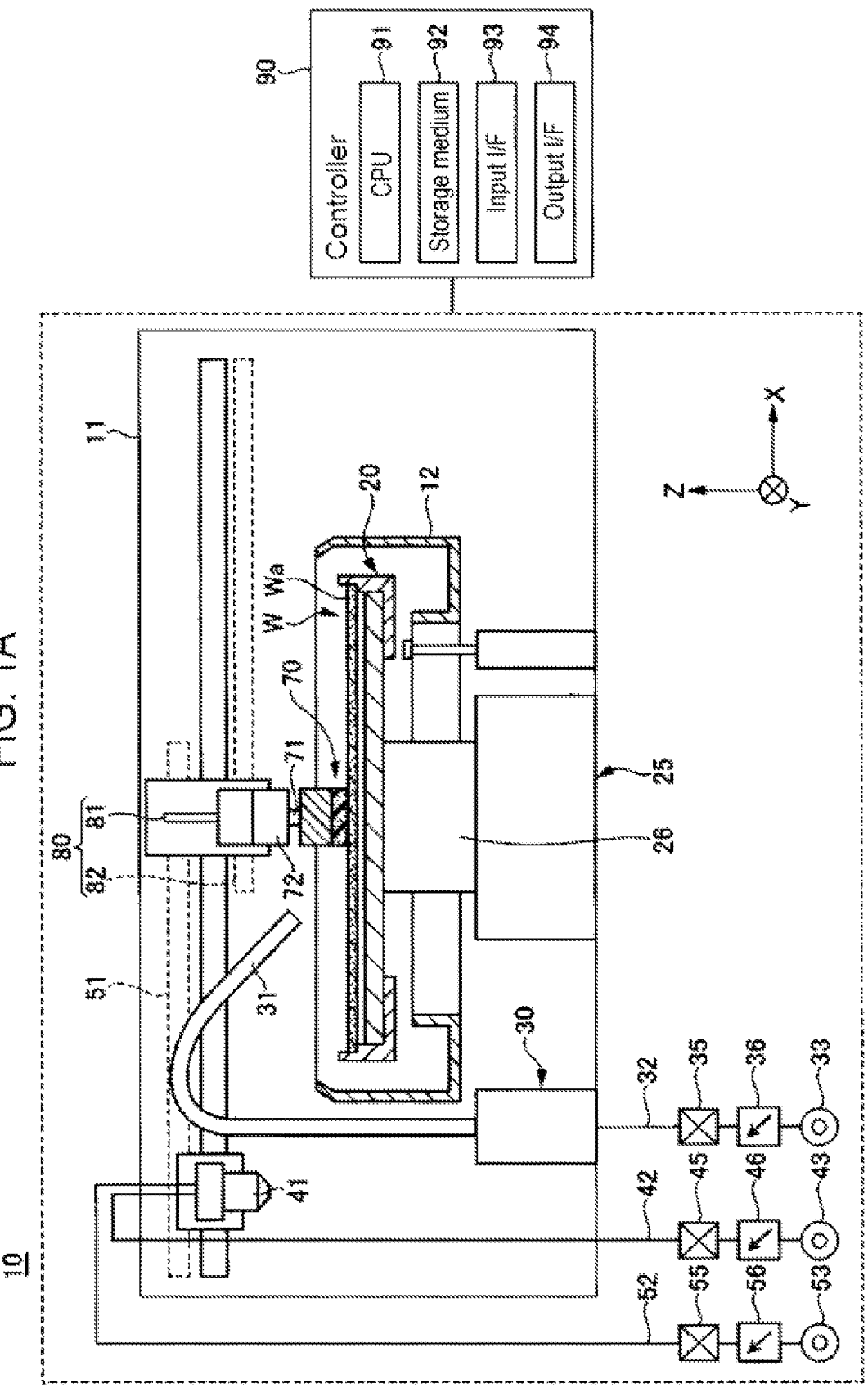
FIG. 1A is a sectional view showing a state of a substrate processing apparatus at the time of polishing according to an embodiment.

Hereinafter, embodiments of the present disclosure will be described with reference to the drawings. Throughout the drawings, in some cases, the same or corresponding configurations will be denoted by the same reference numerals and explanation thereof will not be repeated. In the present disclosure, an X-axis direction, a Y-axis direction, and a Z-axis direction are orthogonal to each another. The X-axis direction and the Y-axis direction are the horizontal direction, and the Z-axis direction is the vertical direction. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As shown in FIGS. 1A and 1B, a substrate processing apparatus 10 includes a holding part 20, a rotating part 25, a liquid supply part 30, a polishing head 70, a moving part 80, and a controller 90. The holding part 20 holds a substrate W horizontally. The rotating part 25 rotates the holding part 20 to rotate the substrate W together with the holding part 20. The liquid supply part 30 supplies a cleaning liquid to a first main surface Wa of the substrate W. The polishing head 70 polishes the first main surface Wa of the substrate W. The moving part 80 scans the polishing head 70 in the radial direction of the substrate W in a state in which the polishing head 70 is pressed against the first main surface Wa of the substrate W. The controller 90 controls the rotating part 25, the liquid supply part 30, and the moving part 80. The substrate processing apparatus 10 further includes a housing 11 and a recovery cup 12. Hereinafter, each configuration will be described.

The holding part 20 holds the substrate W horizontally. When the substrate W is held horizontally, the X-axis direction and the Y-axis direction are parallel to the first main surface Wa of the substrate W. The X-axis direction is a movement direction of the polishing head 70.

Figure 2:
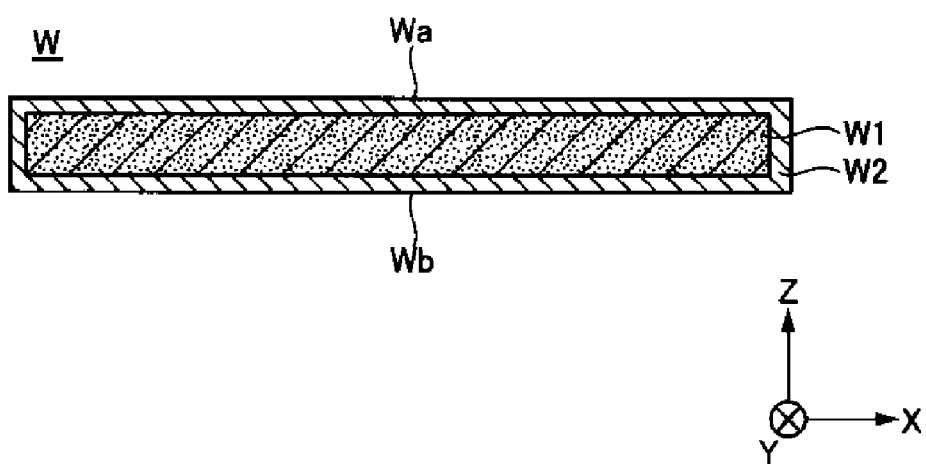
FIG. 2 is a sectional view showing an example of a structure of a substrate.

As shown in FIG. 2, the substrate W includes, for example, an underlying substrate W1 and a film W2 formed on a surface of the underlying substrate W1. The underlying substrate W1 is, for example, a semiconductor substrate or a glass substrate. The semiconductor substrate is a silicon wafer, a compound semiconductor wafer, or the like.

The film W2 is formed on the surface of the underlying substrate W1 by a CVD (chemical vapor deposition) method, an ALD (atomic layer deposition) method, or the like. The film W2 is an amorphous silicon film, a polycrystalline silicon film, a silicon oxide film, a silicon nitride film, or the like. The film W2 may be a TEOS film. The TEOS film is a silicon oxide film formed by using TEOS (tetraethylorthosilicate). The film W2 may have either a single-layer structure or a multi-layer structure.

The substrate W has the first main surface Wa and a second main surface Wb opposite to the first main surface Wa. The first main surface Wa is a surface to be polished by the polishing head 70. On the other hand, the second main surface Wb is a surface to be patterned by a photolithography method, an etching method, or the like after the first main surface Wa is polished. The film W2 on the second main surface Wb is patterned.

Although not shown, an exposure machine forms an exposure pattern on the second main surface Wb of the substrate W in a state in which the first main surface Wa of the substrate W is oriented downward and the substrate W is placed on a stage. The first main surface Wa is mounted on the exposure machine in a state in which the first main surface Wa is previously polished by the polishing head 70 to remove deposits and scratches. Since adsorption distortion of the first main surface Wa is small when the first main surface Wa is mounted on the exposure machine, distortion of the second main surface Wb is also small so that defocus can be reduced, thereby improving the pattern processing accuracy.

The holding part 20 holds the substrate W horizontally in the state in which the first main surface Wa, which is a polishing target, is oriented upward. The holding part 20 is, for example, a mechanical chuck that holds the outer circumference of the substrate W. However, the holding part 20 may be a vacuum chuck or an electrostatic chuck, and may hold a lower surface of the substrate W.

The rotating part 25 is a rotary motor or the like, and rotates the holding part 20 around a vertical rotary shaft 26. The rotating part 25 rotates the holding part 20 while the substrate W is held by the holding part 20. As a result, the substrate W is rotated.

The liquid supply part 30 supplies the cleaning liquid to the first main surface Wa of the substrate W while the substrate W is held by the holding part 20. As the cleaning liquid, for example, DIW (deionized water) is used. The number of cleaning liquids may be plural. A chemical liquid and a rinsing liquid may be used in order as the cleaning liquid. The liquid supply part 30 includes, for example, a first nozzle 31 and a second nozzle 41.

The first nozzle 31 supplies the cleaning liquid to the center of the first main surface Wa of the substrate W while the substrate W is rotating. The cleaning liquid soaks and spreads over the entire first main surface Wa of the substrate W by virtue of a centrifugal force, and is dropped from the peripheral edge of the substrate W. The first nozzle 31 is connected to a liquid source 33 via a pipe 32. An opening/closing valve 35 and a flow rate controller 36 are installed in the pipe 32. When the opening/closing valve 35 opens a flow path of the pipe 32, the cleaning liquid is supplied from the liquid source 33 to the first nozzle 31, and is discharged from the first nozzle 31. A discharge amount of the cleaning liquid is controlled by the flow rate controller 36. On the other hand, when the opening/closing valve 35 closes the flow path of the pipe 32, the supply of the cleaning liquid from the liquid source 33 to the first nozzle 31 is stopped to stop the discharge of the cleaning liquid.

The second nozzle 41 moves in the radial direction of the substrate W while the substrate W is rotating, and supplies the cleaning liquid over the entire first main surface Wa of the substrate W in the radial direction. The liquid supply part 30 includes a moving device 51 configured to move the second nozzle 41 in the radial direction of the substrate W. The second nozzle 41 is a two-fluid nozzle in which the cleaning liquid is pulverized with a gas such as a $N_2$ gas, atomized, and sprayed. A cleaning power of the cleaning liquid can be improved.

Similarly to the first nozzle 31, the second nozzle 41 is connected to a liquid source 43 via a pipe 42. An opening/closing valve 45 and a flow rate controller 46 are installed in the pipe 42. Further, the second nozzle 41 is connected to a gas source 53 via a pipe 52. An opening/closing valve 55 and a flow rate controller 56 are installed in the pipe 52. When the opening/closing valve 55 opens a flow path of the pipe 52, a gas is supplied from the gas source 53 to the second nozzle 41, and is discharged from the second nozzle 41. A discharge amount of the gas is controlled by the flow rate controller 56. On the other hand, when the opening/closing valve 55 closes the flow path of the pipe 52, the supply of the gas from the gas source 53 to the second nozzle 41 is stopped to stop the discharge of the gas.

Various kinds of fluids discharged from the liquid supply part 30 are collected in the recovery cup 12. The recovery cup 12 accommodates the holding part 20 and the substrate W held by the holding part 20 therein, and prevents droplets from scattering from the substrate W. A drainage pipe and an exhaust pipe (not shown) are provided in a bottom wall of the recovery cup 12. The drain pipe discharges the cleaning liquid, and the exhaust pipe discharges the gas.

As shown in FIG. 1A, the polishing head 70 is brought into contact with the first main surface Wa of the substrate W in the state in which the substrate W is held by the holding part 20, and polishes the first main surface Wa. The polishing head 70 has, for example, a cylindrical shape, and a polishing surface of the polishing head 70 in contact with the substrate W is disposed horizontally. The polishing surface of the polishing head 70 is smaller than the first main surface Wa of the substrate W.

The polishing head 70 is connected to a rotary motor 72 via a vertical rotary shaft 71. The rotary motor 72 rotates the polishing head 70 around the rotary shaft 71. A transmission member that transmits a rotational motion of the rotary motor 72 to the rotary shaft 71 may be disposed between the rotary motor 72 and the rotary shaft 71. The transmission member includes, for example, a belt, a pulley, and the like.

Figure 3:
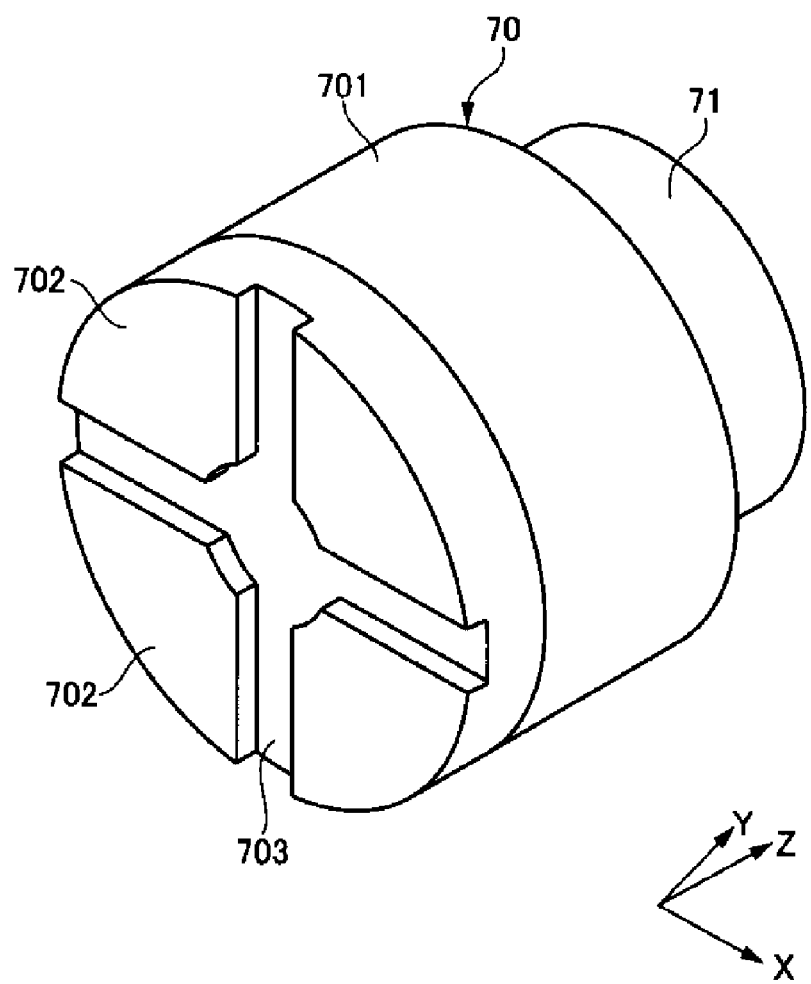
FIG. 3 is a perspective view showing an example of a polishing head.

As shown in FIG. 3, the polishing head 70 includes a mounting part 701 that is exchangeably mounted on the rotary shaft 71, and a polishing layer 702 that is pressed against the substrate W. The polishing layer 702 includes a base material made of resin, and polishing particles dispersedly arranged on the base material. The polishing particles are, for example, diamond particles, silicon carbide particles, or the like. The polishing layer 702 has a cylindrical shape, and the lower surface of the polishing layer 702 polishes the substrate W.

Drainage grooves 703 are formed on the lower surface of the polishing layer 702. A plurality of drainage grooves 703 are formed at equal intervals on the lower surface of the polishing layer 702 in the circumferential direction, and intersect with each another at the center of the lower surface of the polishing layer 702. The cleaning liquid that has entered between the polishing layer 702 and the substrate W is discharged from the center of the lower surface of the polishing layer 702 toward the peripheral edge along the drainage grooves 703.

The structure of the polishing head 70 is not limited to the structure shown in FIG. 3.

As shown in FIG. 1A and the like, the moving part 80 includes, for example, a first moving part 81 and a second moving part 82. The first moving part 81 moves the polishing head 70 in the Z-axis direction and presses the polishing head 70 against the first main surface Wa of the substrate W. Further, the second moving part 82 moves the polishing head 70 in the X-axis direction to scan the polishing head 70 in the radial direction of the substrate W.

The controller 90 is, for example, a computer, and includes a CPU (central processing part) 91 and a storage medium 92 such as a memory. The storage medium 92 stores a program that controls various processes executed by the substrate processing apparatus 10. The controller 90 controls the operation of the substrate processing apparatus 10 by causing the CPU 91 to execute the program stored in the storage medium 92. Further, the controller 90 includes an input interface 93 and an output interface 94. The controller 90 receives external signals through the input interface 93, and transmits signals to the outside through the output interface 94.

The program is stored in, for example, a non-transitory computer-readable storage medium and is installed on the storage medium 92 of the controller 90 from the computer-readable storage medium. Examples of the computer-readable storage medium may include a hard disk (HD), a flexible disk (FD), a compact disc (CD), a magnet optical disc (MO), a memory card, and the like. The program may be downloaded from a server via the Internet and installed on the storage medium 92 of the controller 90.

Figure 4:
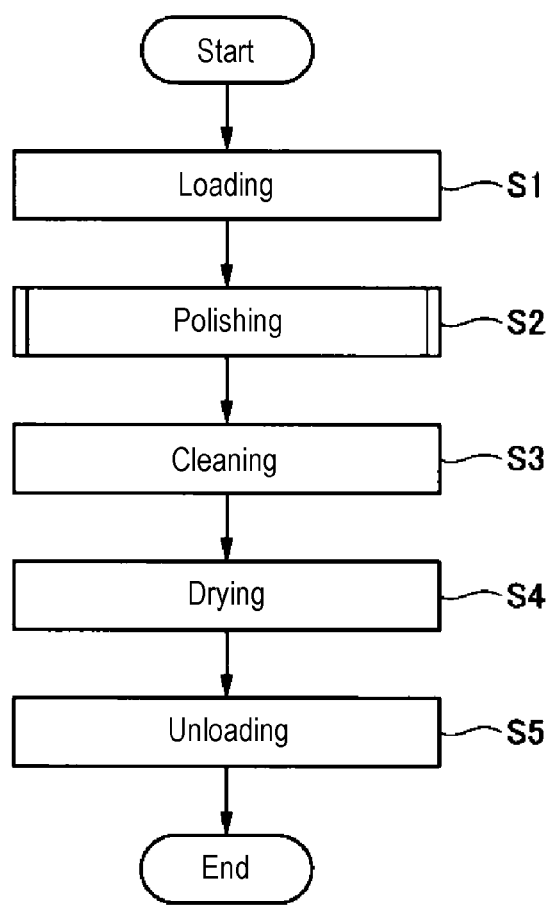
FIG. 4 is a flowchart showing a substrate processing method according to an embodiment.

Next, the operation of the substrate processing apparatus 10, that is, a substrate processing method, will be described with reference to FIG. 4 and the like. As shown in FIG. 4, the substrate processing method includes a loading step S1, a polishing step S2, a cleaning step S3, a drying step S4, and an unloading step S5. This substrate processing method is performed under the control of the controller 90.

In the loading step S1, a transfer device (not shown) loads the substrate W into the substrate processing apparatus 10 and delivers the same to the holding part 20. The holding part 20 holds the substrate W horizontally with the first main surface Wa of the substrate W oriented upward. After delivering the substrate W to the holding part 20, the transfer device is withdrawn outward from the substrate processing apparatus 10.

In the polishing step S2, as shown in FIG. 1A, the first main surface Wa of the substrate W is polished by the polishing head 70 while the substrate W is held by the holding part 20. The first main surface Wa is mounted on the exposure machine while being polished by the polishing head 70 to remove deposits and scratches. Since adsorption distortion of the first main surface Wa is small when the first main surface Wa is mounted on the exposure machine, distortion of the second main surface Wb is also small so that defocus can be reduced, thereby improving the pattern processing accuracy.

In the polishing step S2, the moving part 80 scans the polishing head 70 in the radial direction of the substrate W in a state in which the polishing head 70 is pressed against the first main surface Wa of the substrate W. Further, in the polishing step S2, the rotating part 25 rotates the holding part 20 to rotate the substrate W together with the holding part 20. Further, in the polishing step S2, the rotary motor 72 rotates the polishing head 70.

The controller 90 controls the moving part 80 to control a polishing pressure of the polishing head 70 and a scanning speed of the polishing head 70. Further, the controller 90 controls the rotating part 25 to control a rotation speed of the substrate W. Further, the controller 90 controls the rotary motor 72 to control a rotation speed of the polishing head 70.

Figure 6:
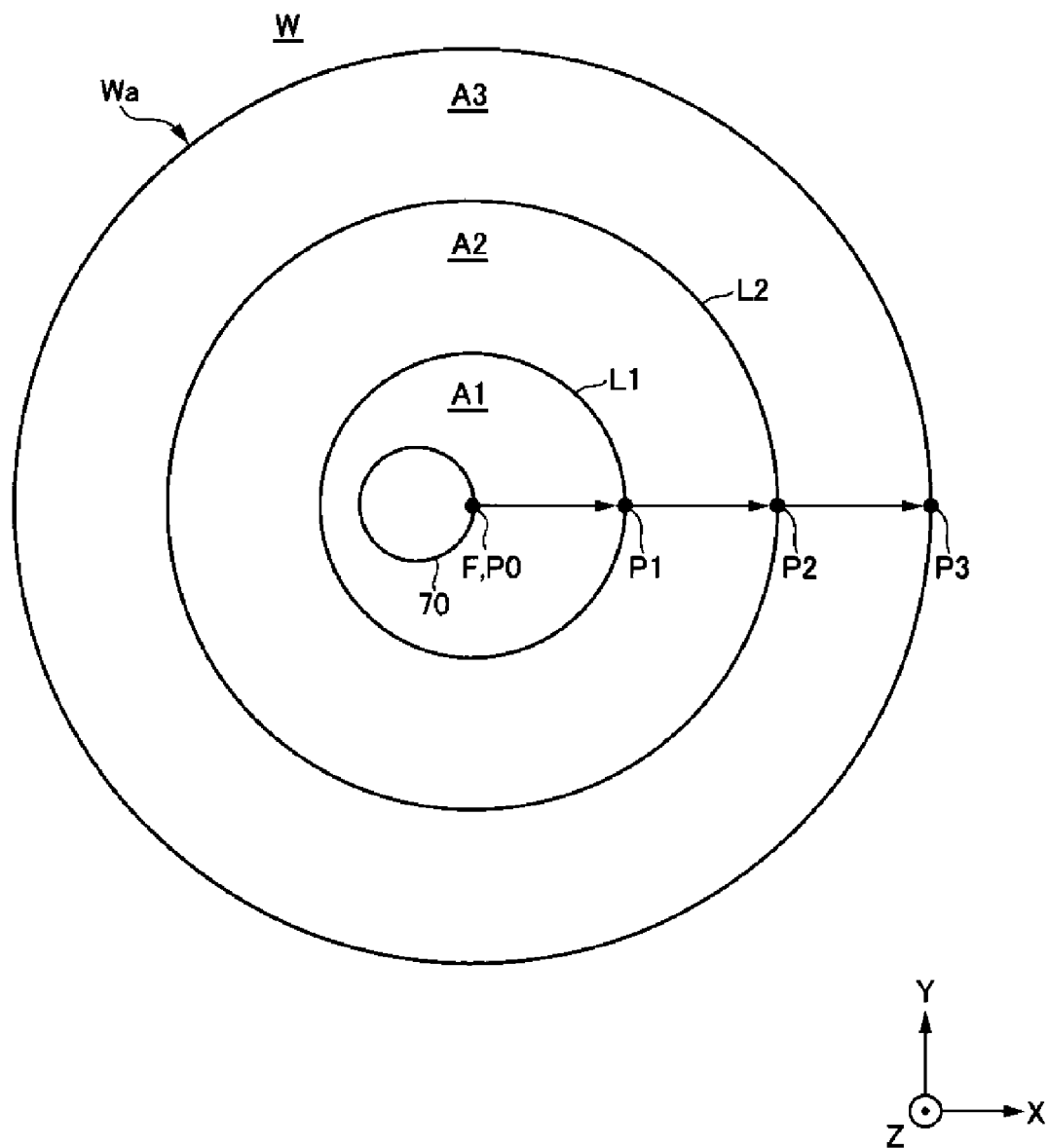
FIG. 6 is a plan view showing an example of a division line that divides a first main surface of the substrate into a plurality of areas in a radial direction.

As shown in FIG. 6, the controller 90 sets two division lines L1 and L2 that divide the first main surface Wa of the substrate W into three areas A1 to A3 in the radial direction of the substrate W. The two division lines L1 and L2 are circles centered on a center point P0 of the first main surface Wa, and divide the first main surface Wa into the three areas A1 to A3 at equal intervals in the radial direction. The number of division lines is not limited to two, and may be one or more. Further, the number of areas may be two or more. Further, the division lines may divide the first main surface Wa at unequal intervals rather than at equal intervals, in the radial direction.

The central area A1 includes the center point P0 of the first main surface Wa of the substrate W and has a radius larger than the diameter of the lower surface of the polishing head 70. The lower surface of the polishing head 70 passes through the center point P0 of the first main surface Wa, a point P1 of the division line L1, and a point P2 of the division line L2 in this order in a state in which the lower surface of the polishing head 70 is pressed against the first main surface Wa of the substrate W, and moves to a point P3 on the peripheral edge of the first main surface Wa.

Figure 5:
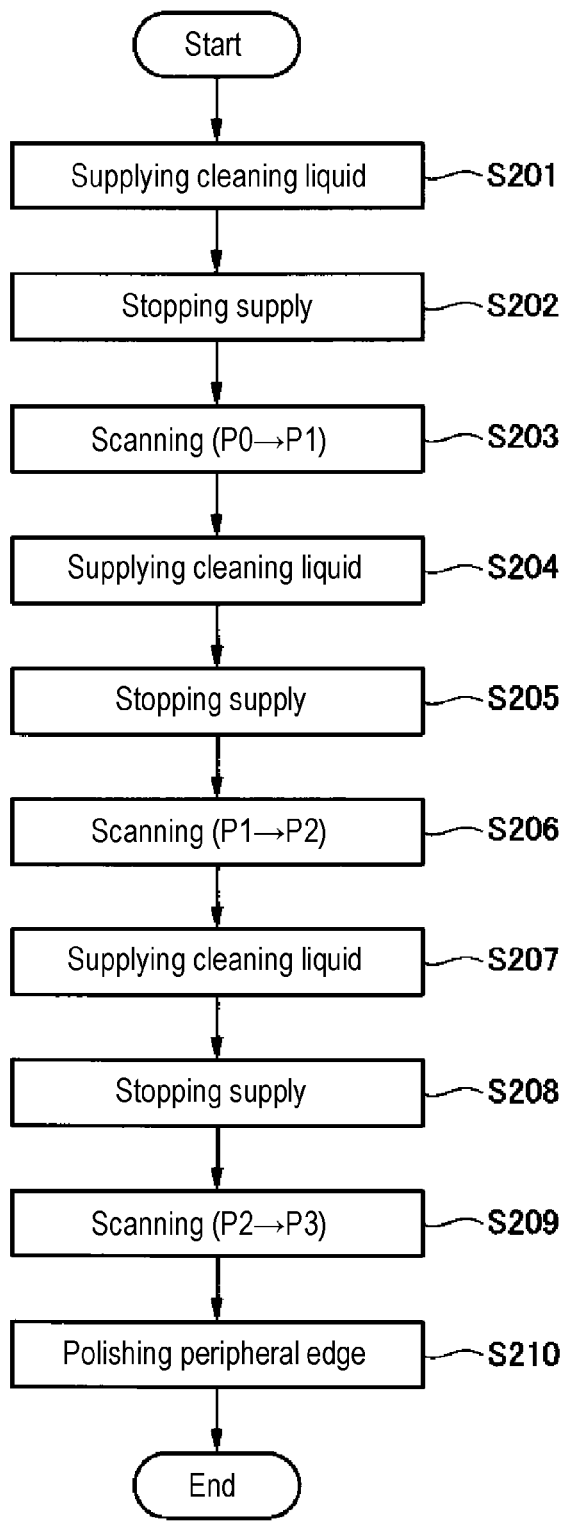
FIG. 5 is a plan view showing an example of polishing of FIG. 4.

As shown in FIG. 5, the controller 90 performs the supply of the cleaning liquid and the scanning of the polishing head 70 in a state in which the subsequent supply of the cleaning liquid is stopped, for each of the areas A1 to A3. The supply of the cleaning liquid and the scanning of the polishing head are managed at the position of a front end F of the polishing head 70. The front end F is a front end in the scanning direction. The details of FIG. 5 are as follows.

First, the first nozzle 31 supplies the cleaning liquid to the center of the first main surface Wa of the substrate W while the substrate W is rotating (S201 in FIG. 5). The cleaning liquid soaks and spreads over the entire first main surface Wa by virtue of a centrifugal force to form a liquid film. During that time, the second nozzle 41 does not supply the cleaning liquid to the substrate W. The polishing head 70 is separated upward from the substrate W and stands by above the substrate W.

After the liquid film is formed, the first nozzle 31 stops the supply of the cleaning liquid (S202 in FIG. 5). Further, after the liquid film is formed, the moving part 80 lowers the polishing head 70 and presses the polishing head 70 against the first main surface Wa of the substrate W. During the formation of the liquid film or before the formation of the liquid film, as shown in FIG. 6, the position of the polishing head 70 is adjusted so that the front end F of the polishing head 70 coincides with the center point P0 of the first main surface Wa when viewed from the top.

Subsequently, in the state in which the polishing head 70 is pressed against the first main surface Wa of the substrate W, the moving part 80 scans the front end F of the polishing head 70 from the center point P0 of the first main surface Wa to the point P1 of the division line L1 (S203 in FIG. 5). During that time, the controller 90 stops supplying the cleaning liquid to the substrate W, and performs the rotation of the substrate W and the polishing head 70.

When the front end F of the polishing head 70 reaches the point P1 of the division line L1, the controller 90 suspends the scanning of the polishing head 70 and temporarily stops the front end F of the polishing head 70 at the point P1 of the division line L1. Then, the controller 90 performs the supply of the cleaning liquid (S204 in FIG. 5).

Specifically, the first nozzle 31 supplies the cleaning liquid to the center of the first main surface Wa of the substrate W while the substrate W is rotating. The cleaning liquid soaks and spreads over the entire first main surface Wa by virtue of a centrifugal force to form the liquid film. During the formation of the liquid film, the moving part 80 keeps pressing the polishing head 70 against the substrate W. During the formation of the liquid film, since the cleaning liquid continues to be supplied, the cleaning liquid flows continuously between the polishing head 70 and the substrate W and the polishing head 70 slips with respect to the substrate W, so that the substrate W is substantially not polished. During the formation of the liquid film, the moving part 80 may separate the polishing head 70 from the substrate W and stand by above the substrate W instead of continuing to press the polishing head 70 against the substrate W. In that case, the moving part 80 lowers the polishing head 70 and presses the polishing head 70 against the substrate W again before resuming the scanning.

After the formation of the liquid film, the first nozzle 31 stops the supply of the cleaning liquid (S205 in FIG. 5).

Subsequently, in the state in which the polishing head 70 is pressed against the first main surface Wa of the substrate W, the moving part 80 scans the front end F of the polishing head 70 from the point P1 of the division line L1 to the point P2 of the other division line L2 (S206 in FIG. 5). During that time, the controller 90 stops the supply of the cleaning liquid to the substrate W and performs the rotation of the substrate W and the polishing head 70.

When the front end F of the polishing head 70 reaches the point P2 of the division line L2, the controller 90 suspends the scanning of the polishing head 70 and temporarily stops the front end F of the polishing head 70 at the point P2 of the division line L2. Then, the controller 90 performs the supply of the cleaning liquid (S207 in FIG. 5). The step S207 is performed in the same manner as in the step S204. After that, the first nozzle 31 stops the supply of the cleaning liquid (S208 in FIG. 5).

Subsequently, in the state in which the polishing head 70 is pressed against the first main surface Wa of the substrate W, the moving part 80 scans the front end F of the polishing head 70 from the point P2 of the division line L2 to the point P3 of the peripheral edge of the first main surface Wa (S209 in FIG. 5). During that time, the controller 90 stops the supply of the cleaning liquid to the substrate W and performs the rotation of the substrate W and the polishing head 70.

When the front end F of the polishing head 70 reaches the point P3 on the peripheral edge of the first main surface Wa of the substrate W, the controller 90 terminates the scanning of the polishing head 70 and stops the front end F of the polishing head 70 at the point P2 of the division line L2. In that state, the controller 90 performs the rotation of the substrate W and the polishing head 70 for a set time to polish the peripheral edge of the substrate W (S210 in FIG. 5). This is because dirt easily adheres to the peripheral edge of the substrate W. According to this embodiment, dirt adhering to the peripheral edge of the substrate W can be removed. After that, the polishing head 70 is separated from the first main surface Wa of the substrate W.

As described above, as shown in FIG. 5, the controller 90 performs the supply of the cleaning liquid and the scanning of the polishing head 70 in the state in which the subsequent supply of the cleaning liquid is stopped, for each of the areas A1 to A3. The controller 90 temporarily suspends the scan during the scanning of the polishing head 70 and supplies the cleaning liquid. It is possible to prevent the liquid film of the cleaning liquid from being cut off during the scanning and thus it is possible to prevent the occurrence of excessive friction. Further, since the controller 90 prohibits the supply of the cleaning liquid during the scanning, a liquid film having an appropriate thickness can be formed between the polishing head 70 and the substrate W. Therefore, while suppressing the occurrence of scratches due to friction, slip can be suppressed and the substrate W can be polished. Moreover, since the liquid film remains, polishing debris can be washed away together with the cleaning liquid by virtue of a centrifugal force. As a result, the substrate W can be polished entirely in the radial direction while suppressing the occurrence of scratches on the substrate W.

Although the controller 90 performs the process shown in FIG. 5 once in the present embodiment, the process may be performed a plurality of times. That is, the number of times of scanning of the polishing head 70 is one in this embodiment, but may be a plurality of times.

Figures 7, 8:
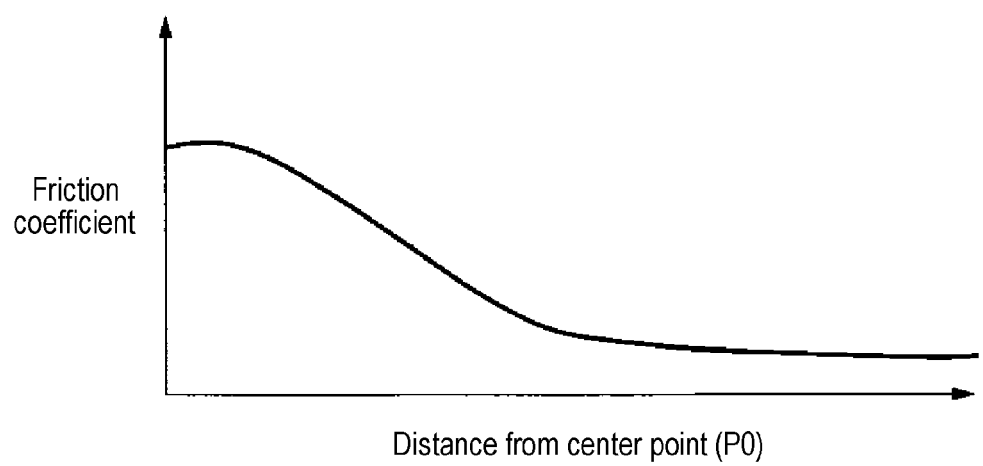
FIG. 7 is a graph showing a relationship between a friction coefficient between the polishing head and the substrate and a distance from the center point of the first main surface of the substrate.
FIG. 8 is a table showing an example of set values used in the polishing of FIG. 4.

By the way, as shown in FIG. 7, when the rotation speed of the substrate W is constant, the friction coefficient between the polishing head 70 and the substrate W decreases as the distance from the center point P0 of the first main surface Wa of the substrate W increases. A curve shown in FIG. 7 is generally called a Strivec Curve.

As the friction coefficient between the polishing head 70 and the substrate W increases, the substrate W is likely to be cut. Therefore, as shown in FIG. 8, the controller 90 sets one or more of the polishing pressure of the polishing head 70, the scanning speed of the polishing head 70, and the rotation speed of the substrate W for each of the areas A1 to A3 in order to cut the plurality of areas A1 to A3 to the same extent.

The larger the polishing pressure of the polishing head 70, the larger the frictional force between the polishing head 70 and the substrate W. Thus, the substrate W can easily be cut. The frictional force is expressed as the product of the polishing pressure and the friction coefficient. Further, when the rotation speed of the substrate W is constant, as the scanning speed of the polishing head 70 decreases, the number in which a specific point on the rotating substrate W crosses over the polishing head 70 during the scanning is increased. Thus, the substrate W is easily to be cut at the specific point. Further, when the scanning speed of the polishing head 70 is constant, as the rotation speed of the substrate W increases, the number in which a specific point on the rotating substrate W crosses over the polishing head 70 during the scan is increased. Thus, the substrate W can easily be cut at the specific point.

As described above, the controller 90 sets one or more of the polishing pressure of the polishing head 70, the scanning speed of the polishing head 70, and the rotation speed of the substrate W for each of the areas A1 to A3. Since the plurality of areas A1 to A3 can be cut to the same extent, the surface roughness of the areas A1 to A3 after polishing can be kept within the same allowable range.

The controller 90 sets one or more of the polishing pressure of the polishing head 70, the scanning speed of the polishing head 70, and the rotation speed of the substrate W according to the conditions of the first main surface Wa of the substrate W. Data indicating the relationship between the conditions of the first main surface Wa of the substrate W and the set values is created in advance by experiment or the like and stored in the storage medium 92. The controller 90 acquires the conditions of the first main surface Wa of the substrate W from an external computer via the input interface 93, and refers to the above data stored in the storage medium 92 to determine the set values. In addition, the conditions of the first main surface Wa of the substrate W can be acquired by a surface inspection means such as a camera or a laser provided in the substrate processing apparatus 10. The controller 90 may determine the conditions of the first main surface Wa of the substrate W from the inspection result of the surface inspection means to determine the set values.

The conditions of the first main surface Wa of the substrate W includes a material of the film W2 formed on the first main surface Wa. In a case in which the material of the film W2 is an amorphous silicon, the hardness of the film W2 becomes softer and the film W2 can more easily be cut compared with a case in which the material of the film W2 is silicon oxide or silicon nitride.

Therefore, as the hardness of the film W2 becomes softer, the polishing pressure of the polishing head 70 is set to be smaller. Further, as the hardness of the film W2 becomes softer, the scanning speed of the polishing head 70 is set to be higher. Alternatively, as the hardness of the film W2 becomes softer, the rotation speed of the substrate W is set to be lower.

The conditions of the first main surface Wa of the substrate W may include the thickness of the film W2 in addition to the material of the film W2. The thicker the film W2, the more easily the difference in the material of the film W2 is expressed by the difference in the hardness of the film W2.

The conditions of the first main surface Wa of the substrate W includes a radial distribution of the surface roughness of the first main surface Wa after polishing. The surface roughness is expressed by, for example, a Haze value. The larger the Haze value, the larger the surface roughness. The reflectance of light or the like may be used instead of the Haze value. The smaller the reflectance, the larger the surface roughness.

If the surface roughness is too small, it means that the amount of polishing is too small. On the other hand, if the surface roughness is too large, it means that the amount of polishing is too large. Therefore, the polishing pressure of the polishing head 70 and the like are set so that the surface roughness is kept within the allowable range.

For example, as the surface roughness becomes larger, the polishing pressure of the polishing head 70 is set to be smaller. Further, as the surface roughness becomes larger, the scanning speed of the polishing head 70 is set to be higher. Alternatively, as the surface roughness becomes larger, the rotation speed of the substrate W is set to be smaller.

The order of setting change may be the order of the polishing pressure of the polishing head 70, the scanning speed of the polishing head 70, and the rotation speed of the substrate W, or vice versa. A degree of influence of the setting change on the ease of cutting of the substrate W is greater in the order of the polishing pressure of the polishing head 70, the scanning speed of the polishing head 70, and the rotation speed of the substrate W.

Therefore, when it is desired to greatly change the polishing amount of the substrate W, the priority of the setting change is the order of the polishing pressure of the polishing head 70, the scanning speed of the polishing head 70, and the rotation speed of the substrate W. On the other hand, when it is desired to change the polishing amount of the substrate W to be small, the priority of the setting change is the order of the rotation speed of the substrate W, the polishing pressure of the polishing head 70, and the scanning speed of the polishing head 70.

In the cleaning step S3 of FIG. 4, first, the first nozzle 31 supplies the cleaning liquid to the center of the first main surface Wa of the substrate W. The cleaning liquid soaks and spreads over the entire first main surface Wa by virtue of a centrifugal force, and dirt separated from the substrate W is drifted radially outward of the substrate W. A rinsing liquid such as DIW is used as the cleaning liquid. In addition, a chemical liquid and a rinsing liquid may be used as the cleaning liquid in order.

In the cleaning step S3 of FIG. 4, subsequently, the second nozzle 41 gradually moves from a position immediately above the center of the substrate W to a position immediately above the peripheral edge of the substrate W while discharging the cleaning liquid toward the first main surface Wa of the substrate W, and stops at the position immediately above the peripheral edge of the substrate W for a set time. This is because dirt easily adheres to the peripheral edge of the substrate W.

Further, the movement direction of the second nozzle 41 is the radial outward direction of the substrate W in the present embodiment, but may be a radial inward direction of the substrate W. Further, the number of times of the scanning of the second nozzle 41 is one in the present embodiment, but may be plural.

In the cleaning step S3 of FIG. 4, the first nozzle 31 further supplies the cleaning liquid to the center of the first main surface Wa of the substrate W. The cleaning liquid soaks and spreads over the entire first main surface Wa by virtue of a centrifugal force, and dirt separated from the substrate W is drifted radially outward of the substrate W. A rinsing liquid such as DIW may be used as the cleaning liquid.

In the drying step S4 of FIG. 4, the rotating part 25 rotates the holding part 20 at a high speed to drop the cleaning liquid adhering to the substrate W from the substrate W. At the end of the cleaning step S3, the liquid film of the rinsing liquid may be replaced with a liquid film of a dry liquid having a surface tension smaller than that of the rinsing liquid. In that case, the dry liquid is dropped in the drying step S4. For example, IPA (isopropyl alcohol) or the like may be used as the dry liquid.

In the unloading step S5 of FIG. 5, a transfer device (not shown) enters the inside of the substrate processing apparatus 10, receives the substrate W from the holding part 20, and unloads the substrate W from the substrate processing apparatus 10. After that, this process ends.

Figure 9:
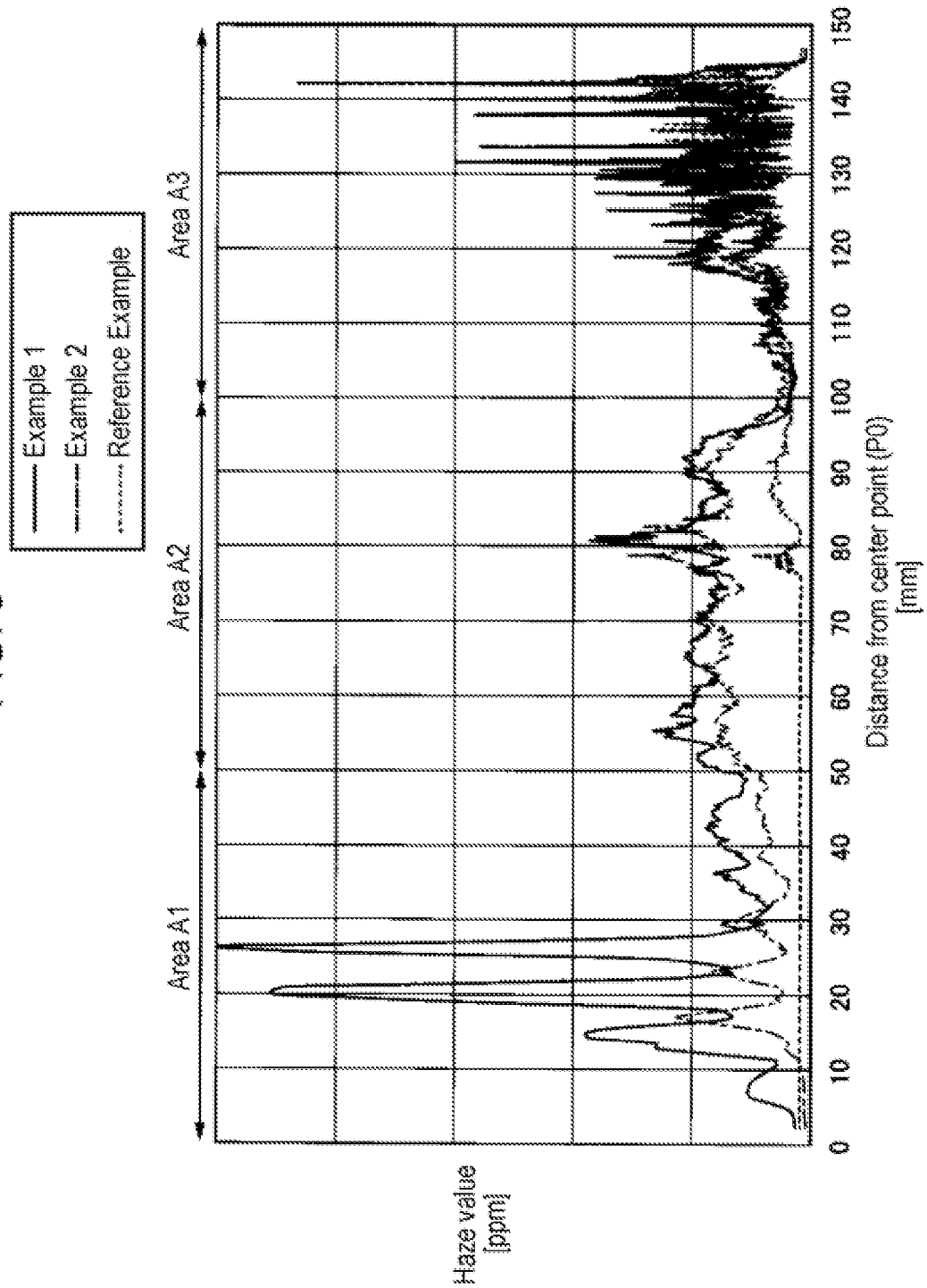
FIG. 9 is a graph showing a relationship between a haze value after polishing in Examples 1 and 2 and Reference Example 1 and a distance from the center point of the first main surface of the substrate.

Next, experimental data will be described with reference to Table 1 and FIG. 9. Table 1 shows the polishing conditions in Examples 1 and 2 and Reference Example 1.

TABLE 1

| | Area A1 | | | | Area A2 | | | | Area A3 | | | |
|---|---|---|---|---|---|---|---|---|---|---|---|---|
| | V [mm/s] | N1 [rpm] | T [s] | N2 [Times] | V [mm/s] | N1 [rpm] | T [s] | N2 [Times] | V [mm/s] | N1 [rpm] | T [s] | N2 [Times] |
| Example 1 | 9 | 1000 | 8.9 | 148 | 5 | 1000 | 10 | 167 | 7 | 1000 | 8.9 | 148 |
| Example 2 | 9 | 750 | 8.9 | 111 | 5 | 1000 | 10 | 167 | 7 | 1000 | 8.9 | 148 |
| Reference | 15 | 1000 | 10.7 | 178 | 10 | 1000 | 10 | 167 | 7 | 1000 | 17.7 | 295 |

In Table 1, V represents the scanning speed of the polishing head 70, N1 represents the rotation speed of the substrate W, T represents the polishing time of the substrate W in each area A1 to A3, and N2 represents the number of rotations (N2=N1×T/60) of the substrate W during time T. Here, "60" is a coefficient for correcting the unit of time T from "second" to "minute". T in the area A1 is the time in step S203 in FIG. 5, T in the area A2 is the time in step S206 in FIG. 5, and T in the area A3 is the total time in steps S209 and S210 in FIG. 5.

In both Examples 1 and 2 and Reference Example, the substrate W includes a silicon wafer, a silicon oxide film, and a polycrystalline silicon film in this order. The radius of the substrate W was 150 mm. The two division lines L1 and L2 divided the substrate W into three areas at equal intervals in the radial direction. The polishing pressure was constant at a level of 1.5N.

In Reference Example, as in Patent Document 1, V was gradually reduced while scanning the polishing head 70 radially outward from radially inward of the substrate W. Further, in Reference Example, as in Patent Document 1, the cleaning liquid was continuously supplied during the scanning of the polishing head 70. The Haze value after polishing was small in the areas A1 and A2 excluding the area A3 in the radial outward direction of the substrate W, as indicated by a broken line in FIG. 9. Therefore, it can be found that the amount of polishing was not sufficient in the areas A1 and A2 excluding the area A3 in the outside of the substrate W in the radial direction.

Therefore, in Example 1, unlike Reference Example, the supply of the cleaning liquid was stopped during the scanning of the polishing head 70, as shown in FIG. 5. Further, in Example, V was set to be the smallest in the middle of scanning the polishing head 70 radially outward from radially inward of the substrate W. The Haze value after polishing was large in all the areas A1, A2, and A3, as indicated by a solid line in FIG. 9. Therefore, it can be found that the amount of polishing was sufficient in all the areas A1, A2, and A3.

By the way, in Example 1, the Haze value in the area A1 in the radial inward direction of the substrate W was larger than the Haze values in the other areas A2 and A3. Therefore, in Example 1, it can be found that the polishing amount in the radial inward direction of the substrate W was larger than the polishing amount in the other areas A2 and A3.

Therefore, in Example 2, in order to reduce the amount of polishing in the area A1 in the radial inward direction of the substrate W, the substrate W was polished under the same conditions as in Example 1 except that N1 in the area A1 is reduced. The Haze value after polishing was about the same in all the areas A1, A2, and A3, as indicated by a dash-dot line in FIG. 9. Therefore, in Example 2, it can be found that the polishing amount was about the same in all the areas A1, A2, and A3.

According to the present disclosure in some embodiments, it is possible to polish the entire substrate in a radial direction of the substrate while suppressing the occurrence of scratches on the substrate.

Although the embodiment of the substrate processing apparatus and the substrate processing method according to the present disclosure has been described above, the present disclosure is not limited to the above embodiment and the like. Various changes, modifications, replacements, additions, deletions, and combinations are possible within the category of the claims. It is natural that these also belong to the technical scope of the present disclosure.

What is claimed is:

1. A substrate processing apparatus comprising:
a holding part configured to hold a substrate;
a rotating part configured to rotate the holding part to rotate the substrate together with the holding part;
a liquid supply part configured to supply a cleaning liquid to a main surface of the substrate;
a polishing head configured to polish the main surface of the substrate;
a moving part configured to move the polishing head in a radial direction of the substrate to scan the main surface of the substrate while pressing the polishing head against the main surface of the substrate; and
a controller programmed to control the rotating part, the liquid supply part, and the moving part to execute:
setting one or more division lines that divide the main surface of the substrate into a plurality of areas in the radial direction of the substrate; and
while rotating the substrate by the rotating part, performing a cycle including:
supplying, by the liquid supply part, the cleaning liquid to the main surface of the substrate to form a liquid film on the main surface of the substrate;
after the liquid film is formed, stopping the supply of the cleaning liquid;
in a state in which the supply of the cleaning liquid is stopped, moving, by the moving part, the polishing head to scan the main surface of the substrate; and
when the polishing head reaches one of the division lines, stopping the movement of the polishing head.

2. The substrate processing apparatus of claim 1, wherein the controller sets one or more of a polishing pressure of the polishing head, a scanning speed of the polishing head, and a rotation speed of the substrate for each of the plurality of areas.

3. The substrate processing apparatus of claim 2, wherein the controller further sets one or more of the polishing pressure of the polishing head, the scanning speed of the polishing head, and the rotation speed of the substrate according to a condition of the main surface of the substrate.

4. The substrate processing apparatus of claim 3, wherein the condition of the main surface of the substrate includes a material of a film formed on the main surface.

5. The substrate processing apparatus of claim 4, wherein the condition of the main surface of the substrate further includes a radial distribution of a surface roughness of the main surface after polishing.

6. The substrate processing apparatus of claim 3, wherein the condition of the main surface of the substrate includes a radial distribution of a surface roughness of the main surface after polishing.

7. A substrate processing method comprising:
setting one or more division lines that divide a main surface of a substrate into a plurality of areas in a radial direction of the substrate; and
while rotating the substrate, performing a cycle including:
supplying a cleaning liquid to the main surface of the substrate to form a liquid film on the main surface of the substrate;
after the liquid film is formed, stopping the supply of the cleaning liquid;
in a state in which the supply of the cleaning liquid is stopped, moving a polishing head to scan the main surface of the substrate; and
when the polishing head reaches one of the division lines, stopping the movement of the polishing head.

8. The substrate processing method of claim 7, further comprising: setting one or more of a polishing pressure of the polishing head, a scanning speed of the polishing head, and a rotation speed of the substrate for each of the plurality of areas.

9. The substrate processing method of claim 8, further comprising: setting one or more of the polishing pressure of the polishing head, the scanning speed of the polishing head, and the rotation speed of the substrate according to a condition of the main surface of the substrate.

10. The substrate processing method of claim 9, wherein the condition of the main surface of the substrate includes a material of a film formed on the main surface.

11. The substrate processing method of claim 10, wherein the condition of the main surface of the substrate further includes a radial distribution of a surface roughness of the main surface after polishing.

12. The substrate processing method of claim 9, wherein the condition of the main surface of the substrate includes a radial distribution of a surface roughness of the main surface after polishing.

* * * * *